United States Patent
Sasaki et al.

(10) Patent No.: US 8,506,850 B2
(45) Date of Patent: Aug. 13, 2013

(54) CONDUCTIVE FINE PARTICLES, ANISOTROPIC CONDUCTIVE ELEMENT, AND CONNECTION STRUCTURE

(75) Inventors: Taku Sasaki, Osaka (JP); Hiroshi Natsui, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 170 days.

(21) Appl. No.: 13/262,326

(22) PCT Filed: Mar. 17, 2010

(86) PCT No.: PCT/JP2010/054540
§ 371 (c)(1),
(2), (4) Date: Nov. 8, 2011

(87) PCT Pub. No.: WO2010/113641
PCT Pub. Date: Oct. 7, 2010

(65) Prior Publication Data
US 2012/0056136 A1  Mar. 8, 2012

(30) Foreign Application Priority Data

Mar. 31, 2009 (JP) ................................ 2009-087145
Aug. 12, 2009 (JP) ................................ 2009-187429
Sep. 25, 2009 (JP) ................................ 2009-221275

(51) Int. Cl.
*H01B 1/02* (2006.01)
*H01B 1/22* (2006.01)
*B32B 5/16* (2006.01)
*B05D 7/00* (2006.01)

(52) U.S. Cl.
USPC ........ 252/512; 252/513; 252/514; 252/520.1; 428/403; 428/407; 427/212

(58) Field of Classification Search
USPC .............. 252/512, 513, 514, 520.1; 428/403, 428/407; 427/212
See application file for complete search history.

(56) References Cited

U.S. PATENT DOCUMENTS

| 6,906,427 B2 * | 6/2005 | Tanaka et al. ................. 257/778 |
| 7,226,660 B2 * | 6/2007 | Kuroda et al. ................ 428/403 |
| 7,566,494 B2 * | 7/2009 | Jun et al. ........................ 428/323 |
| 2008/0164300 A1 * | 7/2008 | Alcoe et al. .............. 228/180.22 |
| 2010/0112353 A1 * | 5/2010 | Sun et al. ...................... 428/407 |

FOREIGN PATENT DOCUMENTS

| JP | 8-227613 | 9/1996 |
| JP | 2000-288771 | 10/2000 |
| JP | 2005-254246 | 9/2005 |
| JP | 2006-9112 | 1/2006 |
| JP | 2008-282801 | 11/2008 |

OTHER PUBLICATIONS

International Search Report issued Jun. 15, 2010 in International (PCT) Application No. PCT/JP2010/054540.

* cited by examiner

*Primary Examiner* — Mark Kopec
*Assistant Examiner* — Jaison Thomas
(74) *Attorney, Agent, or Firm* — Wenderoth, Lind & Ponack, L.L.P.

(57) ABSTRACT

The present invention provides a conductive fine particle capable of suppressing a blackening phenomenon during storage and thus providing high connection reliability; an anisotropic conductive material containing the conductive fine particle; and a connection structure.

The conductive particle which has a base fine particle, and a conductive layer and a low-melting point metal layer that are formed in the stated order on the surface of the base fine particle, wherein the low-melting point metal layer has an arithmetic mean surface roughness of 50 nm or lower.

10 Claims, 7 Drawing Sheets

(a)

(b)

(c)

Tin Lα1, Silver Lα1, Copper Lα1,2, Nickel Kα1

Tin Lα1, Silver Lα1, Copper Lα1,2, Nickel Kα1

Tin Lα1, Silver Lα1, Copper Lα1,2, Nickel Kα1

CONDUCTIVE FINE PARTICLES, ANISOTROPIC CONDUCTIVE ELEMENT, AND CONNECTION STRUCTURE

This application is a U.S. national stage of International Application No. PCT/JP2010/054540 filed Mar. 17, 2010.

TECHNICAL FIELD

The present invention relates to a conductive fine particle capable of suppressing a blackening phenomenon and thus providing high connection reliability; an anisotropic conductive material containing the conductive fine particle; and a connection structure.

BACKGROUND ART

ICs or LSIs, in a conventional way of producing an electronic circuit board, have been bonded onto a printed circuit board through soldering of the electrodes thereof to the printed circuit board. Soldering, however, does not enable effective bonding of the ICs or LSIs onto the printed circuit board, and does not contribute to an increase in the packaging density of ICs or LSIs.

In order to solve this, the BGA (ball grid array) technology has been developed which bonds ICs or LSIs onto the substrate using solder balls produced by forming solder into spherical shapes. According to this technology, it was possible to produce electric circuits while reconciling high productivity and high connection reliability by connecting the substrate, the chip and solder balls mounted on the substrate or the chip while melting solder balls at high temperature.

However, multi-layer substrates have been more used in recent years, and those multi-layer substrates, sensitive to the environmental conditions, are sometimes distorted, expanded or contracted to cause disconnection of the connection portions.

Patent Document 1 discloses, as a way of solving such a problem, conductive fine particles produced by forming a metal layer (conductive layer) containing highly conductive metal therein on the surface of each resin fine particle, and forming a low-melting point metal layer (solder layer) containing metal such as tin on the above metal layer. The conductive fine particles can ease the stress added thereto with the flexible resin fine particles, and enable, with the low-melting point metal layer formed on the outermost surface of each particle thereof, easy conductive connection between the electrodes.

The low-melting point metal layer, if formed on the surface of the metal layer through a method such as electroplating, has low-melting point metal deposited in the form of crystals and thus has a structure with fine irregularities on the surface thereof. In the case that the low-melting point metal layer has such a shape, the conductive fine particles are rubbed against each other during storage, which rubs the low-melting point metal at some parts off the particles. The rubbed-off metal pieces are oxidized to change into a black fine powder. Thereafter, the powder adheres to the surfaces of the conductive fine particles again through heteroaggregation. This phenomenon is what is called a blackening phenomenon. At the time of melting the conductive fine particles to mount, the blackening phenomenon inhibits the meltability of the low-melting point metal, resulting in poor mounting.

Patent Document 1 also discloses conductive fine particles each uniformly coated with a lubricant, as a way of solving the problem caused by the blackening phenomenon. Since such conductive fine particles are coated with the lubricant on the surfaces thereof, the particles are slightly bonded to each other when used, and are thus easily aggregated.

Patent Document 2 and Patent Document 3 each disclose a method of solving such a problem, i.e., a method of using conductive fine particles which have a molecular film of a metal soap or an organic film on the surface thereof. Those methods unfortunately bring a new problem that impurities are generated from the molecular film of a metal soap or the organic film, and thus the meltability of the low-melting point metal is inhibited.

Patent Document 1: Japanese Kokai Publication 2000-288771 (JP-A 2000-288771)
Patent Document 2: Japanese Kokai Publication 2006-9112 (JP-A 2006-9112)
Patent Document 3: Japanese Kokai Publication 2005-254246 (JP-A 2005-254246)

SUMMARY OF THE INVENTION

Problems to be Solved by the Invention

The present invention aims to provide a conductive fine particle capable of suppressing a blackening phenomenon and thus providing high connection reliability; an anisotropic conductive material containing the conductive fine particle; and a connection structure.

Means for Solving the Problems

The present invention relates to a conductive fine particle, which has a base fine particle, and a conductive layer and a low-melting point metal layer that are formed in the stated order on the surface of the base fine particle, wherein the low-melting point metal layer has an arithmetic mean surface roughness of 50 nm or lower.

The present invention is described in detail below.

The present inventors have made various studies, and have found that, if the low-melting point metal layer has an arithmetic mean surface roughness of 50 nm or lower, the blackening phenomenon caused by rubbed-off low-melting point metal pieces during storage can be suppressed, and therefore the connection reliability of the conductive fine particle is greatly increased. Thereby, the present invention has been completed.

The conductive fine particle of the present invention has a base fine particle, and a conductive layer and a low-melting point metal layer that are formed in the stated order on the surface of the base fine particle, wherein the low-melting point metal layer has an arithmetic mean surface roughness of 50 nm or lower.

Examples of the base fine particle include, but not particularly limited to, resin fine particle, inorganic fine particle, organic-inorganic hybrid fine particle, and metal fine particle. Particularly, resin fine particle is preferable as the base fine particle.

Examples of the resin fine particle include, but not particularly limited to, fine particle of resins such as polyolefin resins, acrylic resins, polyalkylene terephthalate resins, polysulfone resins, polycarbonate resins, polyamide resins, phenol formaldehyde resins, melamine formaldehyde resins, benzoguanamine formaldehyde resins, and urea formaldehyde resins.

Examples of the polyolefin resins include, but not particularly limited to, polyethylene resins, polypropylene resins, polystyrene resins, polyisobutylene resins, and polybutadiene resins. Examples of the acrylic resins include, but not particularly limited to, polymethyl methacrylate resins and polymethyl acrylate resins. Each of these resins may be used alone, or two or more of the resins may be used in combination.

The method of producing the resin fine particle is not particularly limited, and may be, for example, a polymerization method, a method using a polymer protecting agent, or a method using a surfactant. Examples of the polymerization method include, but not particularly limited to, emulsion polymerization, suspension polymerization, seed polymerization, dispersion polymerization, and seed dispersion polymerization.

Examples of the inorganic fine particle include, but not particularly limited to, fine particle of metal oxides such as silica and alumina. Examples of the organic-inorganic hybrid fine particle include, but not particularly limited to, fine particle of a hybrid material containing an acrylic polymer in an organosiloxane skeleton.

Examples of the metal fine particle include, but not particularly limited to, fine particle of a metal such as aluminum, copper, nickel, iron, gold, and silver. Particularly, copper fine particle is preferable. The copper fine particle may be copper fine particle of substantially only copper metal, or may be copper fine particle of a metal containing copper. In the case that the base fine particle is copper fine particle, the later-described conductive layer may not be formed.

In the case that the base fine particle is resin fine particle, the lowest 10% K value of the resin fine particle is preferably 1000 MPa, and the highest 10% K value is preferably 15000 MPa. In the case that the 10% K value is lower than 1000 MPa, the resin fine particle may be destroyed if compression-deformed. In the case that the 10% K value exceeds 15000 MPa, the conductive fine particle may damage the electrodes. The lowest 10% K value is more preferably 2000 MPa, and the highest 10% K value is more preferably 10000 MPa.

The 10% K value can be determined by measuring, with a micro compression tester (for example, "PCT-200" produced by Shimadzu Corp.), the compression displacement (mm) of the resin fine particle when the particle is compressed by a flat end face of a diamond column indenter (diameter: 50 μm) under the conditions of a compression velocity of 2.6 mN/sec and a maximum test load of 10 g; and substituting the values into the following formula.

$$K \text{ value}(N/mm^2) = 3/\sqrt{2} * F * S^{-3/2} * R^{-1/2}$$

F: Force (N) in 10% compressive deformation of resin fine particle

S: Compression displacement in 10% compressive deformation of resin fine particle (mm)

R: Radius of resin fine particle (mm)

The mean particle size of the base fine particles is not particularly limited, and the minimum mean particle size is preferably 1 μm, and the maximum mean particle size is preferably 2000 μm. If the mean particle size of the base fine particles is smaller than 1 μm, the base fine particles may be easily aggregated, and use of conductive fine particles produced from such aggregated base fine particles, each having a low-melting point metal layer formed thereon, may cause a short circuit between adjacent electrodes. If the mean particle size of the base fine particles exceeds 2000 μm, the size may be beyond the range that is appropriate for connection of the electrodes in a circuit board or the like. The minimum mean particle size of the base fine particles is more preferably 3 μm, and the maximum mean particle size is more preferably 1000 μm.

The mean particle size of the base fine particles can be determined by measuring the particle sizes of 50 randomly selected base fine particles with an optical microscope or electron microscope, and averaging the measured particle sizes.

The variation coefficient of the mean particle size of the base fine particles is not particularly limited, and is preferably 10% or lower. If the variation coefficient exceeds 10%, the connection reliability of the conductive fine particle may decrease. The variation coefficient is a value (represented in percentage (%)) that is obtained by dividing the standard deviation determined from the particle size distribution by the mean particle size.

The shape of the base fine particle is not particularly limited as long as the space between corresponding electrodes can be maintained. The shape is preferably a perfect sphere. The base fine particle may have a smooth surface or have a surface with projections.

The conductive fine particle of the present invention has a conductive layer formed on the surface of the base fine particle. The conductive layer serves as an underlying metal layer.

Examples of the metal constituting the conductive layer include, but not particularly limited to, gold, silver, copper, zinc, iron, lead, tin, aluminum, cobalt, indium, nickel, chromium, antimony, bismuth, germanium, and cadmium. Particularly, in terms of the excellence of the conductivity, the metal constituting the conductive layer is preferably gold, copper, or nickel.

The method of forming the conductive layer on the surface of the base fine particle is not particularly limited, and may be a method such as electroless plating, electroplating, vacuum deposition, ion plating, and ion sputtering.

The thickness of the conductive layer is not particularly limited. The minimum thickness is preferably 0.1 μm, and the maximum thickness is preferably 100 μm. If the thickness of the conductive layer is smaller than 0.1 μm, the conductivity may be insufficient. If the thickness of the conductive layer exceeds 100 μm, the flexibility of the conductive fine particle may decrease. The minimum thickness of the conductive layer is more preferably 0.2 μm, and the maximum thickness is more preferably 50 μm.

Here, the thickness of the conductive layer is determined by measuring the cross sections of 10 randomly selected conductive fine particles using a scanning electron microscope (SEM), and then averaging the measured values.

The conductive fine particle of the present invention has a low-melting point metal layer. The low-melting point metal layer melts to bond to the electrodes in a reflow process, and thus establishes electrical continuity between the electrodes.

The low-melting point metal layer of the present invention has an arithmetic mean surface roughness of 50 nm or lower. If the arithmetic mean roughness exceeds 50 nm, the low-melting point metal at some parts is rubbed off during storage, which leads to a blackening phenomenon. The arithmetic mean roughness is preferably 45 nm or lower, and more preferably 25 nm or lower.

The arithmetic mean roughness (Ra) used herein is determined by the method in accordance with JIS B0601.

The low-melting point metal layer preferably contains tin that has, in an XRD measurement, six or more crystal orientations each having a peak intensity ratio of 30% or higher of the peak intensity of a first preferred orientation.

Since the low-melting point metal layer formed on the surfaces of conventional conductive fine particle is made of metal that has low hardness and high ductility, the low-melting point metal layer is sometimes deformed when the conductive fine particles during storage are rubbed against each other or are brought into contact with a mounting device at the time of mounting, and thereby the sphericity of the conductive fine particle is decreased in some cases. This phenomenon causes poor suction of a ball mounter in the mounting process, resulting in poor mounting.

The low-melting point metal layer of the conductive fine particle according to the present invention can show an increase in the hardness and a decrease in the ductility in the case of containing tin that has, in an XRD measurement, six or more crystal orientations each having a peak intensity ratio of 30% or higher of the peak intensity of the first preferred orientation. In this case, the low-melting point metal layers can be prevented from being deformed when the conductive fine particles are rubbed against each other during storage or are brought into contact with a mounting device at the time of mounting. As a result, the problems in the mounting process such as poor absorption of a ball mounter may be reduced.

The "XRD measurement" herein refers to analysis of crystals by X-ray Diffraction measurement.

More specifically, the target crystal is irradiated with X rays such that the intensities of the Bragg reflections in respective crystal orientations are measured.

Thereby, the proportions of the respective crystal orientations in the target crystal are determined from the kinds of the crystal orientations existing in the crystal and the intensity ratios of the orientations.

The "first preferred orientation" refers to the crystal orientation with the highest peak intensity in the case that 2θ, in the XRD measurement, is within the range of 30° to 90°.

The "intensity ratio" refers to an intensity ratio relative to the peak intensity of the first preferred orientation taken as 100%.

Here, the number of "the crystal orientations each having a peak intensity of 30% or higher of the peak intensity of the first preferred orientation" includes the first preferred orientation.

The tin preferably has six or more crystal orientations each having a peak intensity ratio of 30% or higher of the peak intensity of the first preferred orientation.

Having six or more crystal orientations each having an intensity ratio of 30% or higher means that the number of orientations in the tin is large.

The low-melting point metal layer shows an increase in the hardness and a decrease in the ductility in the case of containing such tin. Accordingly, the low-melting point metal layers can be prevented from being deformed when the conductive fine particles are rubbed against each other during storage or are brought into contact with a mounting device at the time of mounting. As a result, the problems in the mounting process such as poor absorption of a ball mounter may be reduced.

If the number of crystal orientations each having an intensity ratio of 30% or higher is less than 6, the low-melting point metal layer has low hardness and high ductility, which may result in poor mounting.

The number of crystal orientations each having an intensity ratio of 30% or higher in the present invention is more preferably 6 or more, and preferably 10 or less.

The low-melting point metal constituting the low-melting point metal layer is not particularly limited, and is preferably tin or an alloy containing tin. Examples of the alloy include tin-silver alloys, tin-copper alloys, tin-silver-copper alloys, tin-bismuth alloys, and tin-zinc alloys.

Particularly, in terms of excellent wettability on the respective electrode materials, tin, a tin-silver alloy, and a tin-silver-copper alloy are suitable as the low-melting point metal.

For an increase in the bonding strength between the low-melting point metal layer and the electrodes, the low-melting point metal layer may contain a metal such as nickel, copper, antimony, aluminum, zinc, iron, gold, titanium, phosphorus, germanium, tellurium, cobalt, bismuth, manganese, chromium, molybdenum, and palladium. Particularly in terms of the excellent effect of increasing the bonding strength between the low-melting point metal layer and the electrodes, it is suitable that the low-melting point metal layer contain nickel, copper, antimony, aluminum, and/or zinc.

The amount of the above metal(s) relative to the total amount of the metals in the low-melting point metal layer is not particularly limited, and the minimum amount is preferably 0.0001% by weight, and the maximum amount is preferably 1% by weight. If the amount of the above metal(s) relative to the total amount of the metals in the low-melting point metal layer is within the range of 0.0001 to 1% by weight, the bonding strength between the low-melting point metal layer and the electrodes can be further increased.

The amount of tin in the low-melting point metal layer is preferably 40% by weight or more. If the amount is less than 40% by weight, the effect of the present invention may not be fully provided, which may result in poor mounting. The amount of tin in the low-melting point metal layer means the proportion of tin in the total amount of elements contained in the low-melting point metal layer. The amount of tin in the low-melting point metal layer can be measured using a device such as an Inductively Coupled Plasma-Atomic Emission Spectroscope ("ICP-AES" produced by Horiba, Ltd.) and an X ray fluorescence spectrometer ("EDX-800HS" produced by Shimadzu Corp.).

The thickness of the low-melting point metal layer is not particularly limited. The minimum thickness is preferably 0.1 μm, and the maximum thickness is preferably 200 μm. If the thickness of the low-melting point metal layer is smaller than 0.1 μm, the layer may not provide sufficient bonding with the electrodes when melted through reflowing. If the thickness of the low-melting point metal layer exceeds 200 μm, the particles tend to aggregate in formation of the low-melting point metal layer, and the aggregated conductive fine particles may cause a short circuit between adjacent electrodes. The minimum thickness of the low-melting point metal layer is more preferably 0.2 μm, and the maximum thickness is more preferably 50 μm.

Here, the thickness of the low-melting point metal layer is determined by measuring the cross sections of 10 randomly selected conductive fine particles with a scanning electron microscope (SEM), and averaging the measured values.

The low-melting point metal layer may have an adhesion layer on the conductive layer side. The adhesion layer is preferably formed by displacement plating. In this case, the adhesion between the conductive layer and the low-melting point metal layer is largely increased, and thus poor bonding caused by exposure of the conductive layer after the first mounting can be effectively prevented.

The metal constituting the adhesion layer is preferably tin. Still, the metal may contain an element other than tin, i.e., the metal may be an alloy of tin and another metal. Examples of the alloy include, but not particularly limited to, tin-copper alloys, tin-silver alloys, tin-bismuth alloys, tin-zinc alloys, and tin-indium alloys.

The displacement plating is the method of immersing a plating object in a plating solution containing a metal salt solution, and depositing a metal ion onto a base metal of the plating object by making use of the difference in the ionization tendency between the base metal of the plating object and the metal ion in the displacement-plating solution. For example, in the case that base fine particles, each having a conductive layer made of a metal with high ionization tendency, are immersed into a plating solution containing a metal ion with low ionization tendency, the metal with high ionization tendency is dissolved and an adhesion layer made of the metal with low ionization tendency can be formed.

The displacement plating is a plating method different from electroplating which passes an electric current through the plating solution containing a metal ion with the base metal of the plating object serving as the cathode so that a metal coating is deposited on the surface. The displacement plating is also different from electroless reduction plating which employs a reduction aid to chemically reduction-deposit a metal ion contained in the plating solution onto the base metal surface so that a metal coating is formed on the base metal surface.

The displacement plating solution used in the displacement plating process is not particularly limited as long as it contains a metal ion, and examples thereof include ones containing ions such as tin ions and silver ions. It is preferable to appropriately change the concentration of the metal ion depending on the material of the conductive layer.

To the displacement plating solution, various acids, complexing agents, and other additives may be added in order to lower the potential of the base metal and enable deposition of a metal ion in a plating solution even if the metal ion has higher ionization tendency than the base metal. Further, various counterions such as sulphate ions, nitrate ions, and halide ions may be added as the counterions of the metal ions.

The maximum thickness of the intermetallic diffusion layer disposed between the conductive layer and the low-melting point metal layer of the conductive fine particle according to the present invention, after heated at 150° C. for 300 hours, is preferably 20% of the total thickness of the conductive layer and the low-melting point metal layer.

Conventional conductive fine particle has the following problem in the case of forming a low-melting point metal layer on the surface of a metal layer by a method such as electroplating. That is, heating at the time of mounting tends to cause destruction such as fracture in the interface between the metal layer and the low-melting point metal layer, whereby the connection reliability of the connection structure to be produced and the like is largely decreased.

The present inventors have made various studies to solve such a problem, and have found that, in conductive connection between electrodes, the cause of destruction of the interface between the metal layer (conductive layer) and the low-melting point metal layer is related to the layer made of an intermetallic compound (intermetallic diffusion layer) which is formed between the metal constituting the conductive layer and the metal constituting the low-melting point metal layer. That is, the present inventors have found that, if a vulnerable intermetallic diffusion layer is formed, destruction of the interface starts from the intermetallic diffusion layer when external force is applied.

The present inventors have further made studies, and have found that, in the case that the intermetallic diffusion layer after heated at 150° C. for 300 hours has a thickness of 20% or lower of the total thickness of the conductive layer and the low-melting point metal layer, the destruction of the interface between the conductive layer and the low-melting point metal layer can be suppressed, and thereby connection reliability can be largely increased.

Here, "the intermetallic diffusion layer after heated at 150° C. for 300 hours has a thickness of 20% or lower of the total thickness of the conductive layer and the low-melting point metal layer" suggests that the atomic-level contact between the metal constituting the conductive layer and the metal constituting the low-melting point metal layer during the production process of the conductive fine particle is very small.

This enables to suppress formation of an intermetallic diffusion layer and prevent destruction of the interface, which leads to conductive fine particle with high connection reliability.

If the intermetallic diffusion layer has a thickness exceeding 20% of the total thickness of the conductive layer and the low-melting point metal layer, destruction of the interface may start from the intermetallic diffusion layer.

The minimum thickness of the intermetallic diffusion layer is more preferably 1% of the total thickness of the conductive layer and the low-melting point metal layer, and the maximum thickness is more preferably 16.7% of the total thickness of the conductive layer and the low-melting point metal layer.

The "intermetallic diffusion layer" used herein refers to a layer made of an "intermetallic compound" in which metallic element constituting the conductive layer and the metallic element(s) constituting the low-melting point metal layer are bonded.

The thickness of the intermetallic diffusion layer can be determined with the results obtained by taking electron microscope photographs and conducting linear analysis of the elements with use of a scanning electron microscope (FE-SEM, produced by Horiba, Ltd.).

The method of producing the conductive fine particle according to the present invention is not particularly limited as long as a low-melting point metal layer having a shape as above can be obtained. Examples of the method include a method including the step of forming a conductive layer on the surface of the base fine particle, and the step of forming a low-melting point metal layer on the surface of the conductive layer by bringing low-melting point metal fine particle in contact with the base fine particle that has the conductive layer formed thereon, and then melt-softening the low-melting point metal fine particle through shear compression.

Such a method of producing the conductive fine particle is another aspect of the present invention.

Here, the low-melting point metal layer may be formed by forming an adhesion layer made of tin or the like on the conductive layer through displacement plating, and then forming a layer made of tin or an alloy of tin and at least one other metal.

For the step of forming a conductive layer made of a metal such as copper in the method of producing the conductive fine particle according to the present invention, a known method such as electroless plating can be employed. For the step of forming an adhesion layer, the method described above can be employed.

In the case that the step of forming a low-melting point metal layer is performed by a dry coating method, conductive fine particle, which has a low-melting point metal layer having an arithmetic mean surface roughness of 50 nm or lower, can be suitably produced. Here, the dry coating method is the method including the step of forming a low-melting point metal layer by bringing low-melting point metal fine particle, which is of tin or an alloy of tin and at least one other metal, in contact with the base fine particle that has the conductive layer formed thereon, and then melt-softening the low-melting point metal fine particle through shear compression.

Examples of the dry coating method include a method using a theta composer (produced by Tokuju Co., Ltd.). The theta composer is provided with a vessel having an elliptical cavity, and a rotor that is provided in the cavity and rotates around the same axis as the vessel separately from the vessel.

At the time of mixing, the vessel and the rotor are rotated in the reverse direction from each other so that the shear compressive force can be provided in the gap near the position where the minor axis of the cavity and the major axis of the rotor overlap. Here, the low-melting point metal fine particle is melt-softened through the shear compression, and adhere to the base fine particle. With this process using the shear compression repeated, the conductive fine particle, having a low-melting point metal layer formed on the surface of the conductive layer of the base fine particle, can be produced.

FIG. 1 is a view schematically illustrating an example of the step of forming a low-melting point metal layer on the surface of base fine particle by bringing low-melting point metal fine particle in contact with the base fine particle, and then melting the low-melting point metal fine particle through shear compression. The step illustrated in FIG. 1 employs the method using a theta composer (produced by Tokuju Co., Ltd.) as the method of forming a low-melting point metal layer on the surface of base fine particle.

In the above step, base fine particle 1 and low-melting point metal fine particle 2 are first supplied between a tumbler (vessel) and a rotor blade (rotor) of a theta composer 4. Subsequently, the theta composer 4 is activated and the vessel and the rotor are rotated in reverse direction from each other, so that the low-melting point metal fine particle 2 is melted instantaneously (FIG. 1(a)) through shear compression in the gap near the position where the minor axis of the cavity and the major axis of the rotor overlap, and the low-melting point metal fine particle 2 adheres to the surfaces of the base fine particle 1 (FIG. 1(b)). Then, the processes of FIG. 1(a) and FIG. 1(b) are repeated, and thereby conductive fine particle 3 having a low-melting point metal layer formed on the surface of the base fine particle 1 (FIG. 1(c)) can be obtained.

The step of forming a low-melting point metal layer as illustrated in FIG. 1 in the present invention leads to formation of a low-melting point metal layer on base fine particle that has a size of 200 µm or smaller. Further, selection of low-melting point metal particle enables to form a low-melting point metal layer that has a desired composition. The step also eliminates the need for the complicated steps such as preparing a plating solution, making it possible to produce conductive fine particle by an inexpensive, simple method.

Examples of the method of bringing low-melting point metal fine particle in contact with the base fine particle and then melting the low-melting point fine particle through shear compression include a method of using mixers such as a theta composer (produced by Tokuju Co., Ltd.) and a mechanofusion (produced by Hosokawa Micron Corporation). The theta composer is provided with a vessel having an elliptical cavity, and a rotor that is provided in the cavity and rotates around the same axis as the vessel separately from the vessel. At the time of mixing, the vessel and the rotor are rotated in the reverse direction from each other so that the shear compressive force can be provided in the gap near the position where the minor axis of the cavity and the major axis of the rotor overlap.

The mean particle size of the low-melting point metal fine particles used for forming the low-melting point metal layer is not particularly limited. The minimum mean particle size is preferably 0.1 µm, and the maximum mean particle size is preferably 100 µm. If the mean particle size of the low-melting point metal fine particles is smaller than 0.1 µm, the low-melting point metal fine particles tend to aggregate, and therefore formation of the low-melting point metal layer may be difficult. If the mean particle size of the low-melting point metal fine particles exceeds 100 µm, the particles may not be completely melt-softened through shear compression, and thus formation of the low-melting point metal layer may be difficult. The mean particle size of the low-melting point metal fine particles can be determined by measuring the particle sizes of 50 randomly selected low-melting point metal fine particles using the optical microscope or the electron microscope, and averaging the measured particle sizes.

The mean particle size of the low-melting point metal fine particles is preferably 1/10 or lower of the mean particle size of the base fine particles. If the mean particle size of the low-melting point metal fine particles exceeds 1/10 of the mean particle size of the base fine particles, the low-melting point metal fine particles may not adhere to the conductive layers of the base fine particles to form a coating, through shear compression.

An anisotropic conductive material may be produced by dispersing the conductive fine particle of the present invention in a binder resin. Such an anisotropic conductive material is yet another aspect of the present invention.

Examples of the anisotropic conductive material of the present invention include anisotropic conductive pastes, anisotropic conductive ink, anisotropic conductive adhesives, anisotropic conductive films, and anisotropic conductive sheets.

The binder resin is not particularly limited, and may be an insulating resin. Examples thereof include vinyl resins, thermoplastic resins, curable resins, thermoplastic block copolymers, and elastomers.

Examples of the vinyl resins include, but not particularly limited to, vinyl acetate resins, acrylic resins, and styrene resins.

Examples of the thermoplastic resins include, but not particularly limited to, polyolefin resins, ethylene-vinylacetate copolymers, and polyamide resins.

Examples of the curable resins include, but not particularly limited to, epoxy resins, urethane resins, polyimide resins, and unsaturated polyester resins. The curable resins may be room-temperature curable ones, heat curable ones, photo-curable ones, or moisture curable ones. The curable resin may be used in combination with a curing agent.

Examples of the thermoplastic block copolymers include, but not particularly limited to, styrene-butadiene-styrene block copolymers, styrene-isoprene-styrene block copolymers, hydrogenated products of styrene-butadiene-styrene block copolymers, and hydrogenated products of styrene-isoprene-styrene block copolymers.

Examples of the elastomers include, but not particularly limited to, styrene-butadiene copolymer rubber, and acrylonitrile-styrene block copolymer rubber.

Each of these resins may be used alone, or two or more of the resins may be used in combination.

The anisotropic conductive material of the present invention may contain additives such as an extender, a plasticizer, an adhesion improver, an antioxidant, a thermostabilizer, a light stabilizer, an ultraviolet ray absorbent, a colorant, a flame retardant, and an organic solvent in an amount that does not inhibit the effect of the present invention, as well as the conductive fine particle and the binder resin.

The method of producing the anisotropic conductive material according to the present invention is not particularly limited, and may be, for example, a method of producing an anisotropic conductive material such as an anisotropic conductive paste, anisotropic conductive ink, and an anisotropic conductive adhesive, by adding the conductive fine particle of the present invention to the binder resin and uniformly mixing the mixture so that the particle is dispersed. Alternatively, the method may be a method of producing an anisotropic conductive film, an anisotropic conductive sheet, or the like by adding the conductive fine particle of the present invention to the binder resin; uniformly mixing the mixture so that the particle is dispersed or heat-melting the mixture; and then applying the mixture on the releasing-treatment surface of a release agent such as release paper and a release film to a predetermined film thickness.

The binder resin and the conductive fine particle of the present invention may be used separately without being mixed in production of an anisotropic conductive material.

A connection structure produced from the conductive fine particle of the present invention or the anisotropic conductive material of the present invention is yet another aspect of the present invention.

The connection structure of the present invention is a conductive connection structure that has the conductive fine particle of the present invention or the anisotropic conductive material of the present invention filled between a pair of circuit boards such that connection is provided between the pair of circuit boards.

Effect of the Invention

The present invention can provide a conductive fine particle capable of suppressing a blackening phenomenon during storage and thus providing high connection reliability; an anisotropic conductive material containing the conductive fine particle; and a connection structure.

MODE(S) FOR CARRYING OUT THE INVENTION

Figure 1:
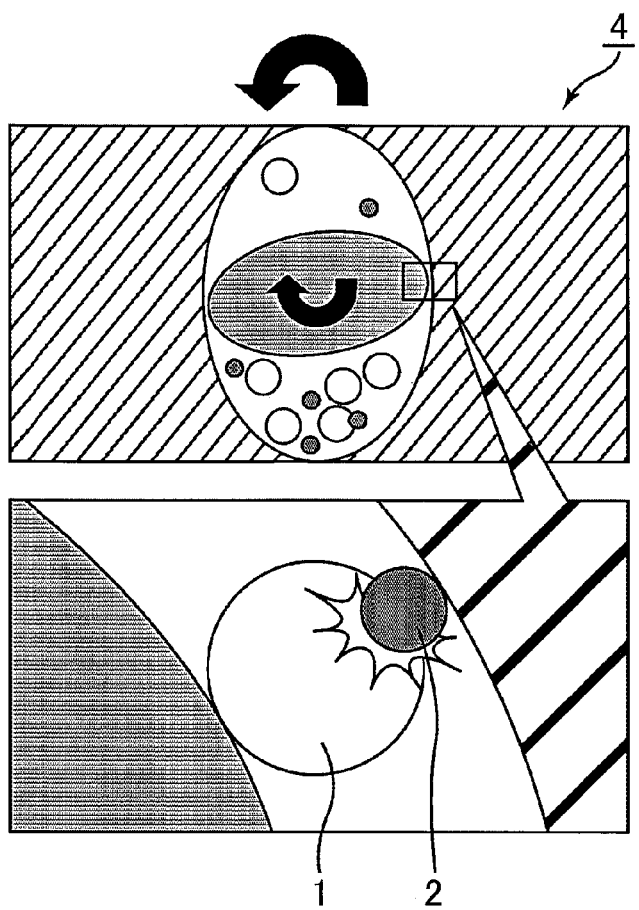
FIG. 1 is a view schematically illustrating an example of the step of forming a low-melting point metal layer in the present invention.
Figure 1:
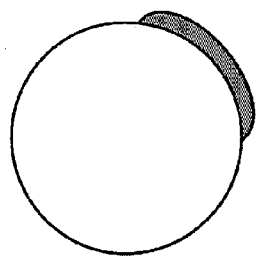
Figure 1:
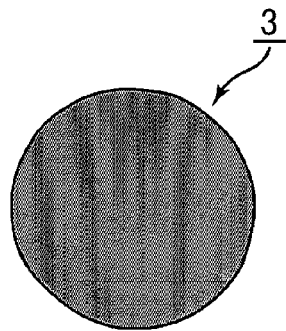

Hereinafter, the present invention will be described in more detail by means of Examples which, however, are not intended to limit the scope of the present invention.

Example 1

A 10-μm-thick copper layer was formed by electroplating on the surface of each of resin fine particles (mean particle size: 240 μm) prepared using a copolymer of tetramethylolmethane tetraacrylate and divinylbenzene, to obtain base fine particles.

Subsequently, 90 g of the obtained copper layer-formed base fine particles was subjected to displacement plating with 500 g of a tin plating solution (plating solution temperature: 20° C.) that has the following composition, so that a 0.5-μm-thick tin layer was formed on the surface of each of the copper layer-formed resin particles.

(Tin Plating Solution Composition)

| Sulfuric acid tin | 15 g |
| Methanesulfonic acid | 75 g |
| Thiourea | 45 g |
| Water | 365 g |

The resin fine particles each having the copper layer and the tin layer formed thereon, and 165 g of fine particles (particle size distribution: 5 to 15 μm) of an alloy of tin 96.5:silver 3.5 were mixed in a theta composer (produced by Tokuju Co., Ltd.). Through the mixing, the fine particles of an alloy of tin 96.5: silver 3.5 adhered to the resin fine particles to coat each of the particles, forming a layer of an alloy of tin 96.5: silver 3.5 having a thickness of 25 μm. Thereby, the conductive fine particles were obtained. At the time of mixing using a theta composer, the tumbler (vessel) was rotated at 35 rpm and the rotor blade (rotor) was rotated at 3500 rpm in the reverse direction from each other, for activation of the shear compressive force. The mixing time was 300 minutes.

Here, the sphericities of 50 randomly selected conductive fine particles were determined using an optical microscope or an electron microscope, and the determined sphericities were averaged. The resulting sphericity was 99.4%. The sphericity was determined by calculating the areas of the circumscribed circle and inscribed circle in contact with the conductive fine particle in the projection photograph taken with an optical microscope or an electron microscope, and substituting the values into the following formula.

$$\{1-(\text{circumscribed circle area}-\text{inscribed circle area})/\text{circumscribed circle area}\}\times 100$$

Example 2

Conductive fine particles were produced by the same procedure as that for Example 1, except that copper fine particles (mean particle size: 260 μm) were used in place of the resin fine particles (mean particle size: 240 μm) of Example 1, and thus no copper layer was formed.

Example 3

Conductive fine particles were produced by the same procedure as that for Example 1, except that fine particles (particle size distribution: 5 to 15 μm) of an alloy of tin 96.5:silver 3.0:copper 0.5 were used in place of the fine particles (particle size distribution: 5 to 15 μm) of an alloy of tin 96.5:silver 3.5 of Example 1.

Example 4

Conductive fine particles were produced by the same procedure as that for Example 1, except that fine particles (particle size distribution: 5 to 15 μm) of an alloy of tin 42.0: bismuth 58.0 were used in place of the fine particles (particle size distribution: 5 to 15 μm) of an alloy of tin 96.5: silver 3.5 of Example 1.

Comparative Example 1

A copper layer and a tin layer were formed on the surface of each of resin fine particles (mean particle size: 240 μm) prepared using a copolymer of tetramethylolmethane tetraacrylate and divinylbenzene, by the same procedure as that for Example 1.

The resin fine particles each having a copper layer and a tin layer formed thereon was subjected to electroplating so that a 96.5:3.5 tin-silver alloy layer having a thickness of 25 μm. Thereby, conductive fine particle were produced.

Here, the sphericities of 50 randomly selected conductive fine particles were determined using an optical microscope or an electron microscope, and the determined sphericities were averaged. The resulting sphericity was 99.5%.

<Evaluation>

The conductive fine particles obtained in Examples and Comparative Examples were subjected to the following tests.

Table 1 shows the results thereof.

(1) Surface Roughness Measurement

The arithmetic mean surface roughness of obtained conductive fine particles was determined by the method based on JIS B0601-1994, using an atomic force microscope (VN-8000: produced by KEYENCE CORPORATION). In the determination, the surface was subjected to quadratic surface adjustment (automatic), and the same adjustment was made for the cross-sectional shape.

Figure 2:
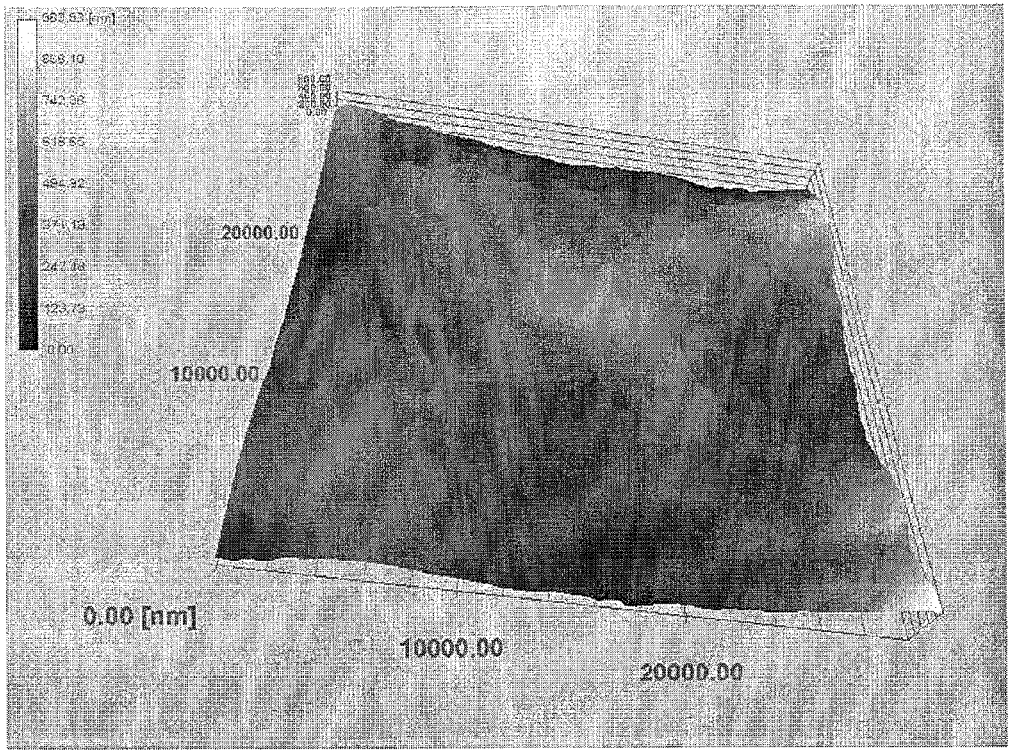
FIG. 2 is an atomic force microscope image of the surface of a conductive fine particle obtained in Example 1.
Figure 8:
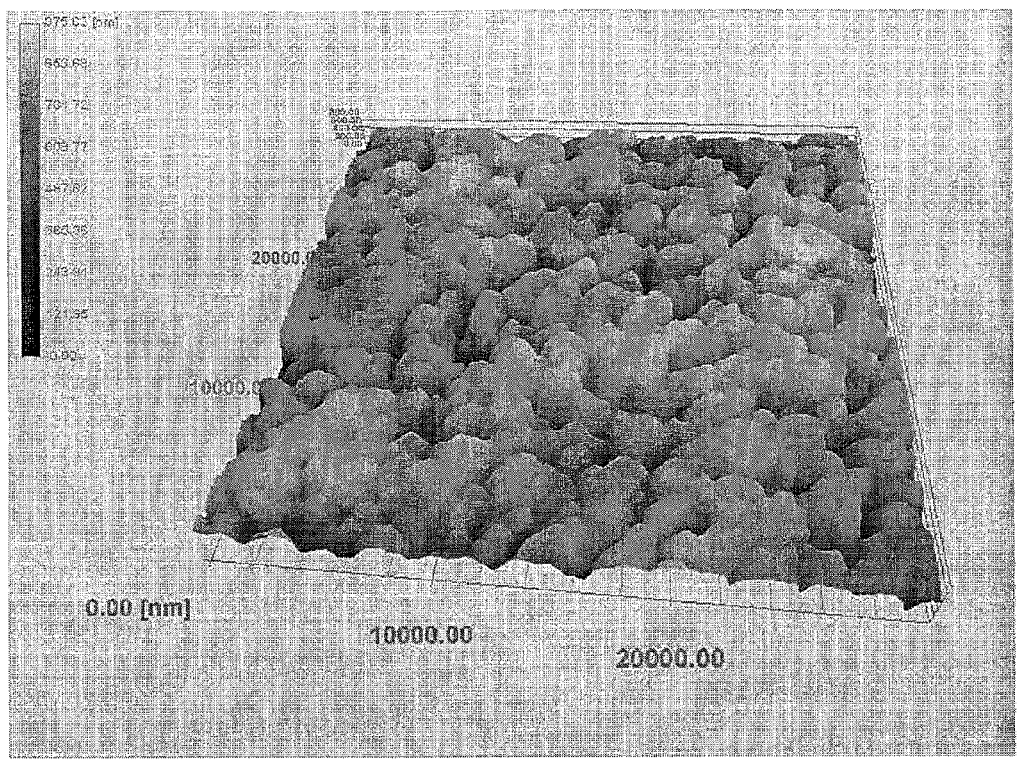
FIG. 8 is an atomic force microscope image of the surface of a conductive fine particle obtained in Comparative Example 1.

FIG. 2 shows the atomic force microscope image of the surface of a conductive fine particle obtained in Example 1, and FIG. 8 shows the atomic force microscope image of the surface of a conductive fine particle obtained in Comparative Example 1.

(2) Blackening-Acceleration Test

The obtained conductive fine particles were put in a glass container, and the container was vibrated with a shaker for one hour. After that, 112 particles of the conductive fine particles were placed on a silicon chip that has copper electrodes, and the chip was put into a reflow furnace heated to 270° C. such that the low-melting point metal was melted. Subsequently, the mounting surface was observed using a scanning electron microscope, and the total number of particles, the low-melting point metal layer of which spread on the copper electrode to form bumps, was counted.

(3) Measurement of Thickness of Intermetallic Diffusion Layer

An electron microscope photograph of the cross section in the thickness direction of an obtained conductive fine particle before and after heating at 150° C. for 300 hours was taken using a scanning electron microscope (FE-SEM, produced by Horiba, Ltd.). At the same time, element linear analysis of the particle was conducted. Then, the thickness of the intermetallic diffusion layer was determined from the length for which the copper element and the tin element were intermingled, on a straight line in the thickness direction of the conductive fine particle. The same determination was made for 10 times to determine the mean thickness, and thereby the thickness of the intermetallic diffusion layer was determined.

Table 1 shows the thickness ratio of the intermetallic diffusion layer to the total thickness of the copper layer, the tin layer, and the alloy layer.

Figure 3:
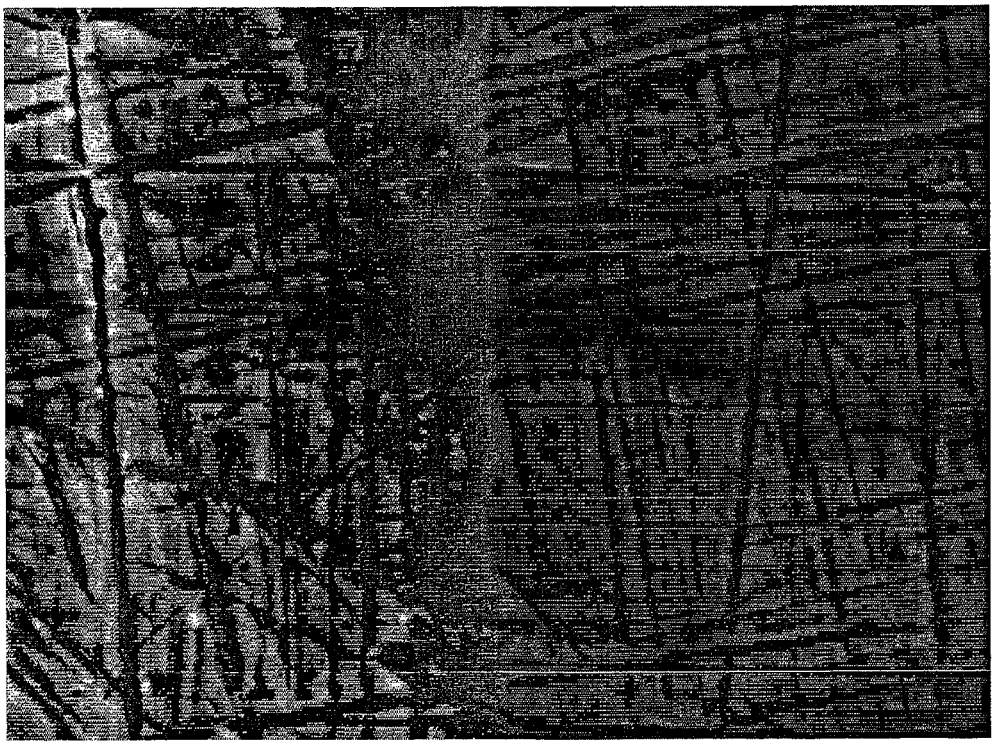
FIG. 3 is an electron microscope photograph of a cross section of a conductive fine particle obtained in Example 1 before heating.
Figure 4:
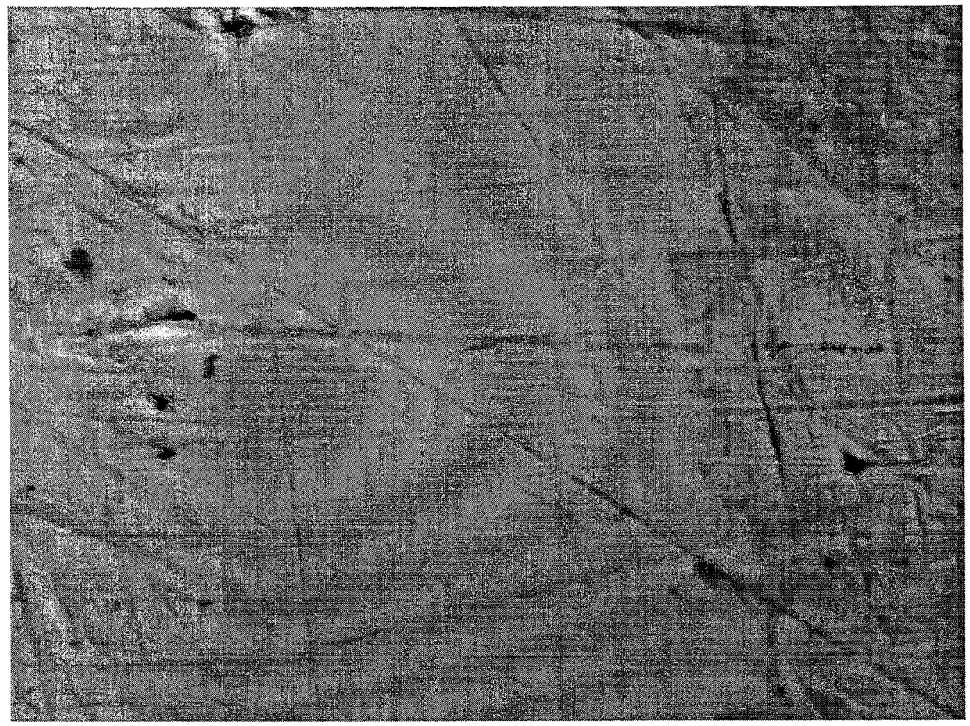
FIG. 4 is an electron microscope photograph of a cross section of a conductive fine particle obtained in Example 1 after the heating.
Figure 9:
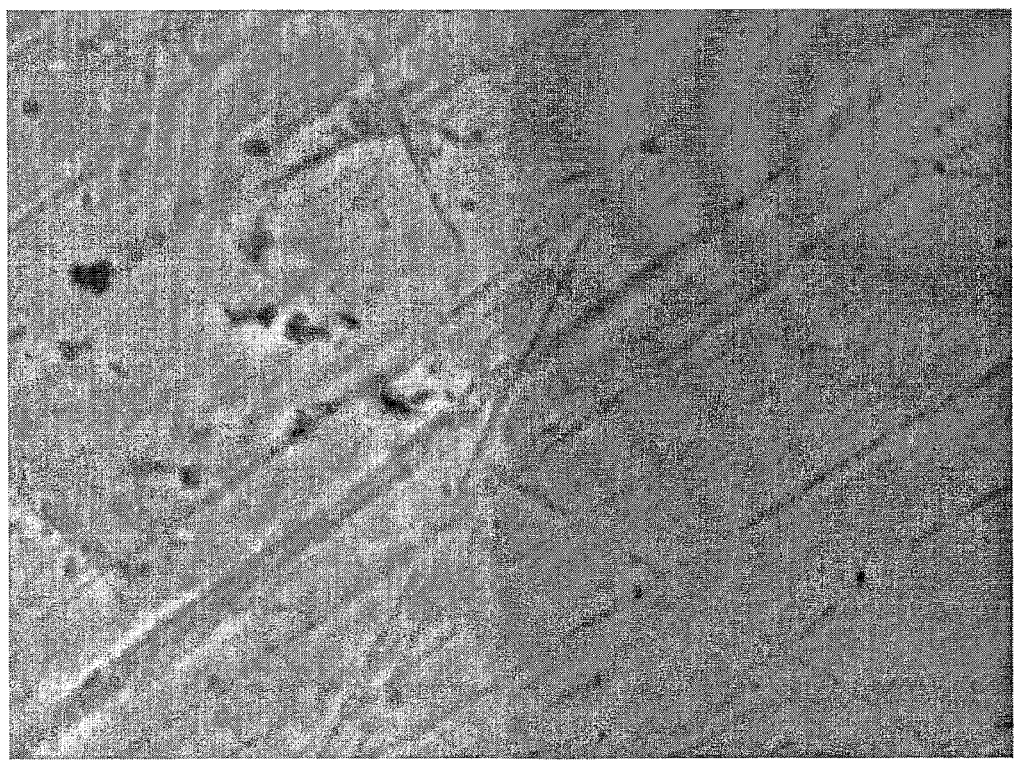
FIG. 9 is an electron microscope photograph of a cross section of a conductive fine particle obtained in Comparative Example 1 before heating.
Figure 10:
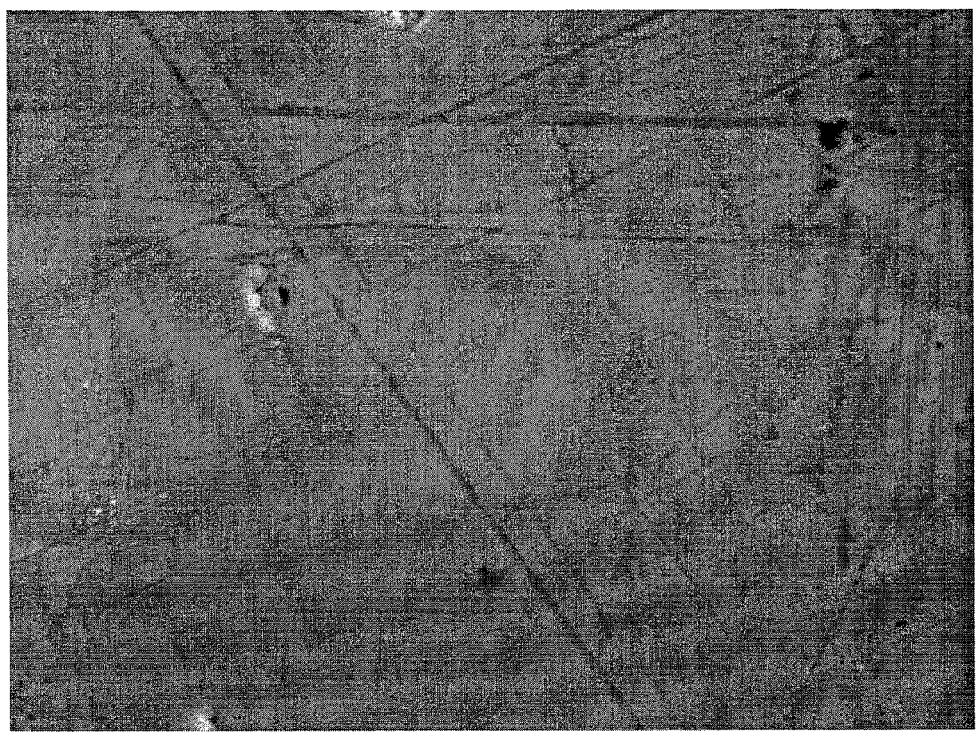
FIG. 10 is an electron microscope photograph of a cross section of a conductive fine particle obtained in Comparative Example 1 after the heating.

FIG. 3 shows an electron microscope photograph of a conductive fine particle obtained in Example 1 before heating, and FIG. 4 shows an electron microscope photograph after the heating. FIG. 9 shows an electron microscope photograph of a conductive fine particle obtained in Comparative Example 1 before heating, and FIG. 10 shows an electron microscope photograph after the heating.

Figure 5:
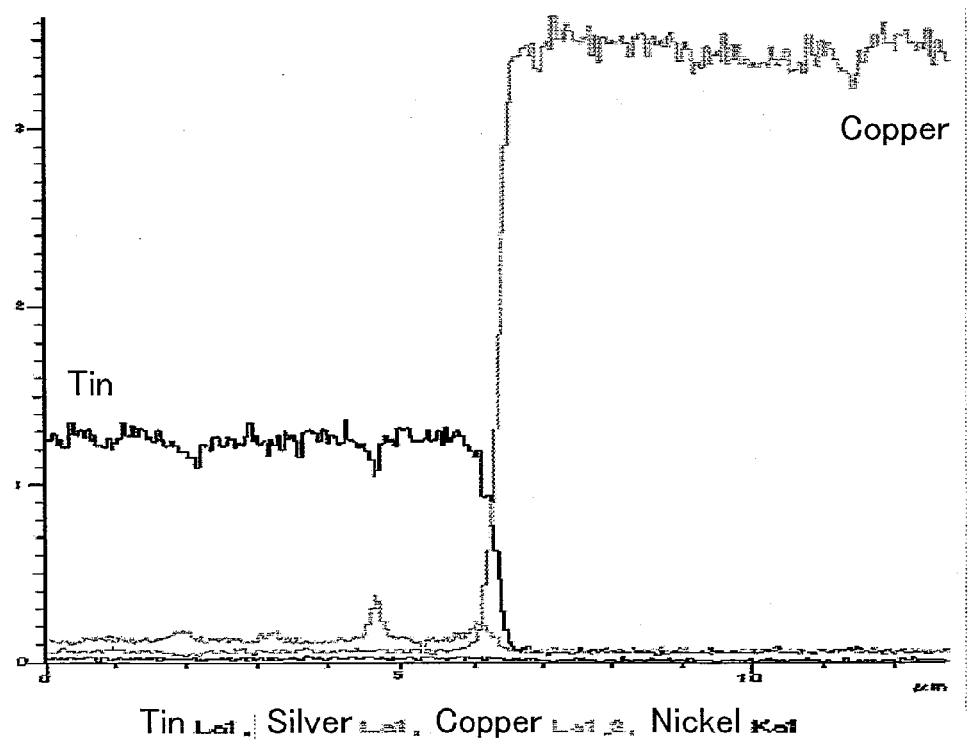
FIG. 5 is a chart of the results of element linear analysis before the heating of the conductive fine particle obtained in Example 1.
Figure 6:
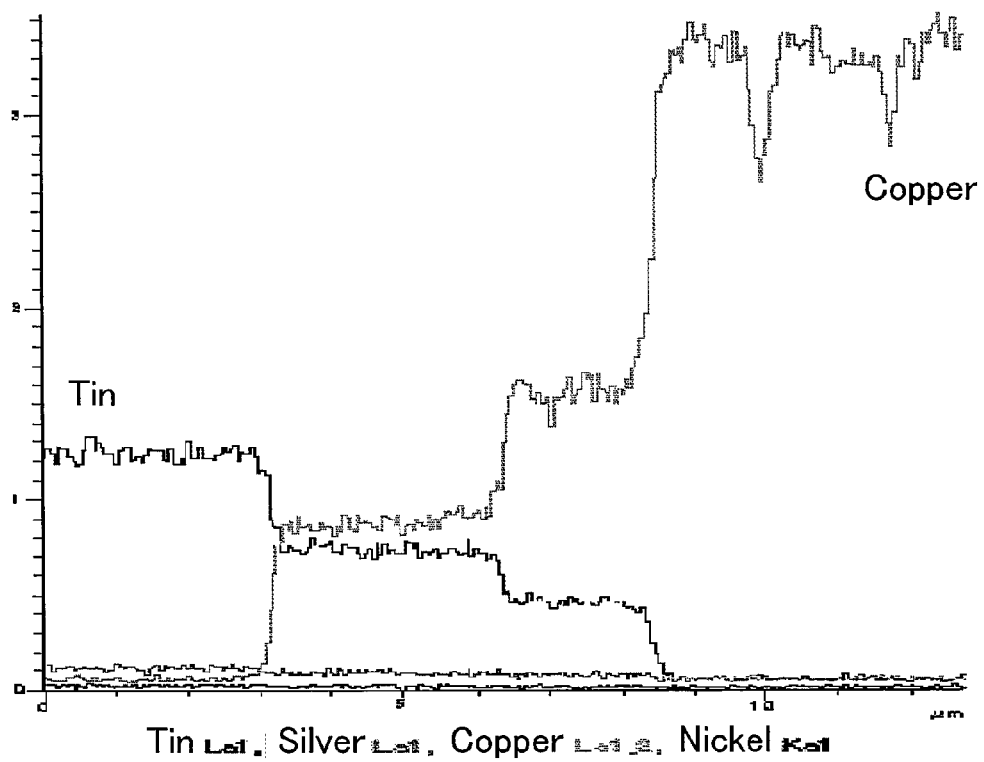
FIG. 6 is a chart of the results of element linear analysis after the heating of the conductive fine particle obtained in Example 1.
Figure 11:
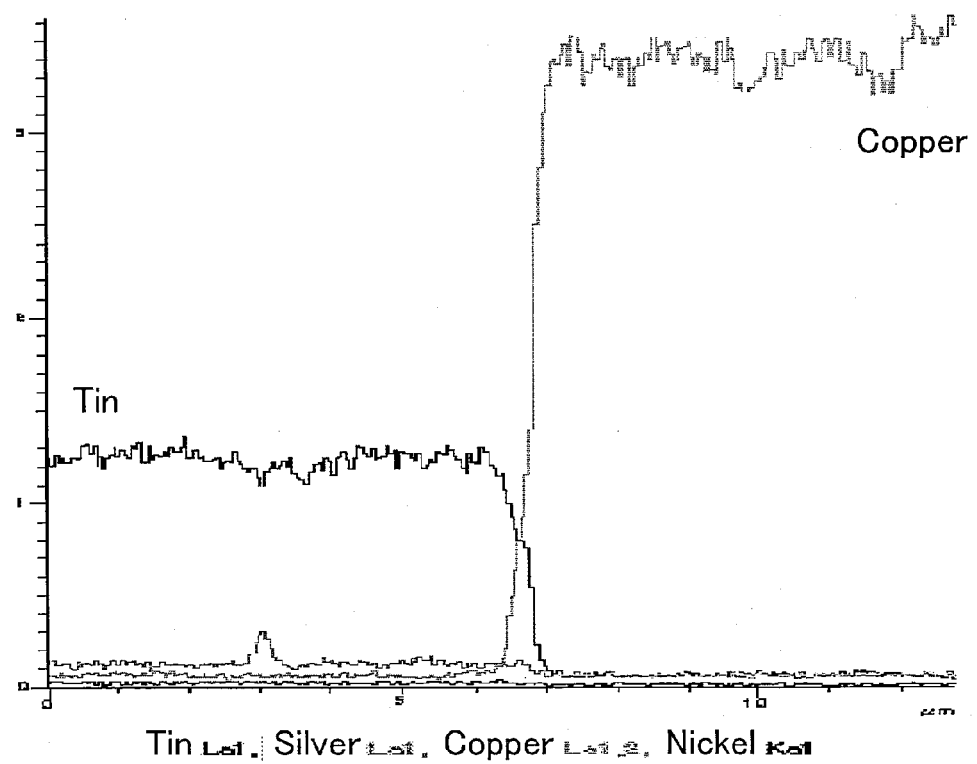
FIG. 11 is a chart of the results of element linear analysis before the heating of the conductive fine particle obtained in Comparative Example 1.
Figure 12:
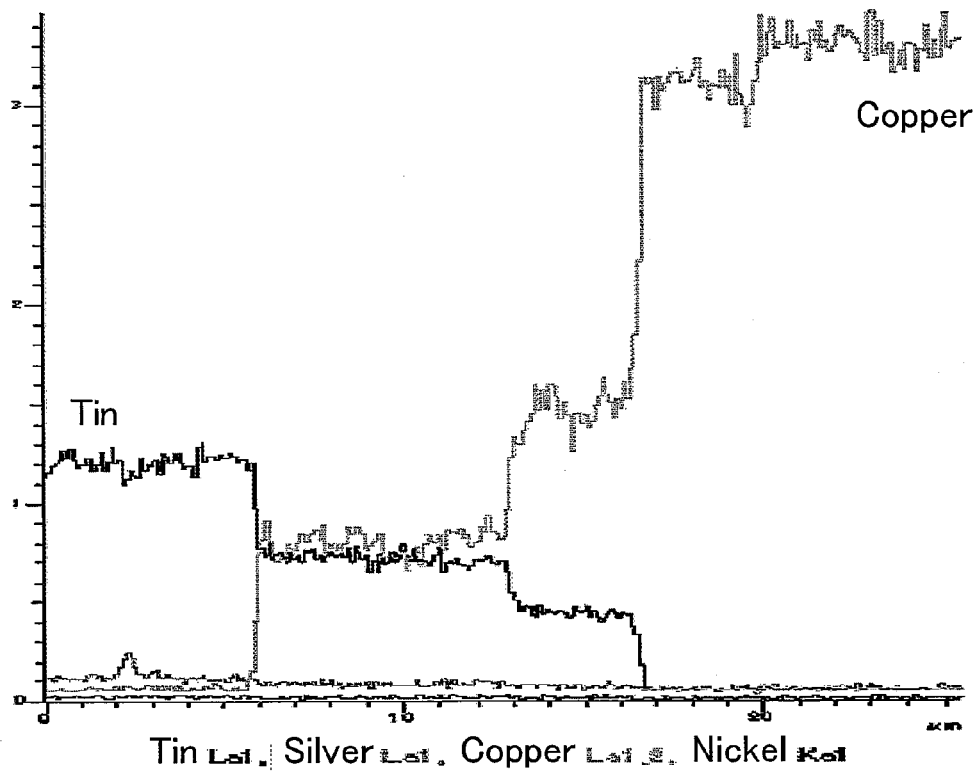
FIG. 12 is a chart of the results of element linear analysis after the heating of the conductive fine particle obtained in Comparative Example 1.

FIG. 5 shows the results of element linear analysis of conductive fine particles obtained in Example 1 before heating, and FIG. 6 shows the results of element linear analysis after the heating. FIG. 11 shows the results of element linear analysis of conductive fine particles obtained in Comparative Example 1 before heating, and FIG. 12 shows the results of element linear analysis after the heating.

(4) Reliability Evaluation

The obtained conductive fine particles were heated at 150° C. for 300 hours, and then 112 particles thereof were placed on a silicon chip having copper electrodes. The chip was put into a reflow furnace heated to 270° C. such that the low-melting point metal was melted. The silicon chip having the conductive fine particles mounted thereon was placed on a substrate having a copper electrode. The substrate was put into a reflow furnace heated to 270° C. to further melt the low-melting point metal. Thereby, a connection structure was obtained.

The obtained connection structure was subjected to a drop test in accordance with JESD22-B111 of the JEDEC standard. The connection structure was repeatedly dropped until disconnection of the connection structure was observed, and the number of drops conducted until the disconnection was determined. If the disconnection did not occur even if the number of drops exceeded 150, the connection structure was evaluated as O. If the disconnection occurred in the number of drops of 150 or less, the connection structure was evaluated as X.

(5) XRD Measurement

XRD measurement of obtained conductive fine particles was performed using an X-ray diffractometer (RINT1000, produced by Rigaku), so that the intensity ratio of each crystal orientation to the first preferred orientation was determined. Table 2 shows the results of Example 1 and Comparative Example 1. Table 2 shows eight peaks with high intensity.

Figure 7:
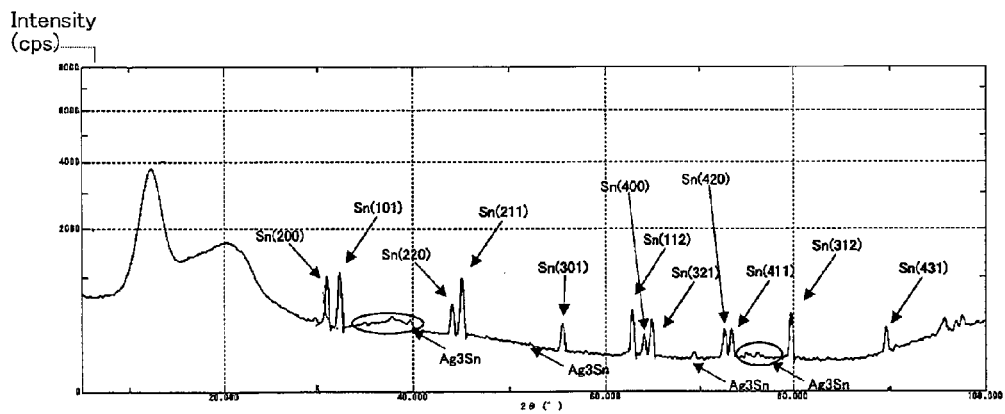
FIG. 7 is a chart of the results of XRD measurement of conductive fine particle obtained in Example 1.
Figure 13:
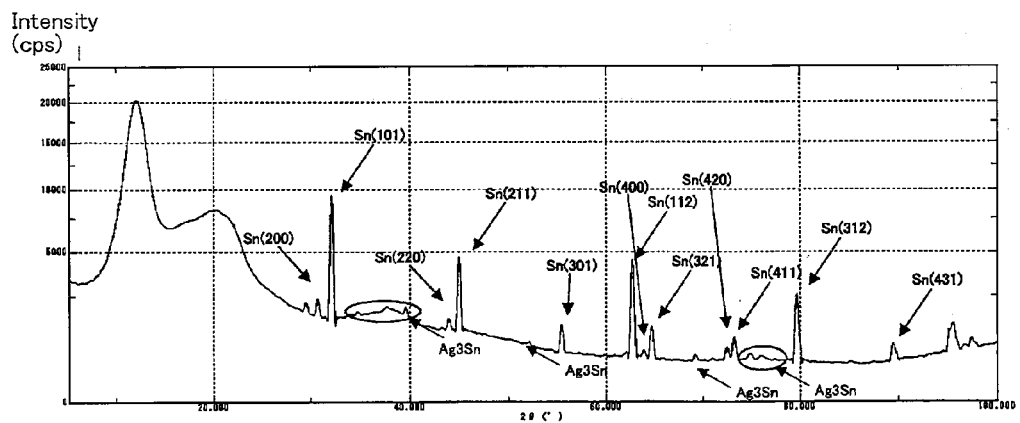
FIG. 13 is a chart of the results of XRD measurement of conductive fine particle obtained in Comparative Example 1.

FIG. 7 shows a chart of the results of the XRD measurement of conductive fine particles obtained in Example 1. FIG. 13 shows a chart of the results of the XRD measurement of conductive fine particles obtained in Comparative Example 1. As shown in FIG. 7 and FIG. 13, Sn(101) is the first preferred orientation in the Example and the Comparative Example.

(6) Deformation Upon Contact

The obtained conductive fine particles and water were mixed in a container, and the contact between the conductive fine particles was promoted by applying an ultrasonic wave (accelerated test). After the ultrasonic wave application, the sphericities of the conductive fine particles were determined.

(7) Poor Mounting with Ball Mounter

The conductive fine particles after the "(6) Deformation upon contact" test were placed on the electrodes on a substrate using a ball mounter, and the ratio of poor mounting of the conductive fine particles was determined.

TABLE 1

|  | Arithmetic mean roughness (nm) | Mounting-surface observation (/112 particles) | Intermetallic diffusion layer before heating test Layer thickness | Intermetallic diffusion layer after heating test | | Reliability evaluation result |
|---|---|---|---|---|---|---|
|  |  |  |  | Layer thickness | Layer thickness ratio |  |
| Example 1 | 25.5 | 107 | 0.56 μm | 5.61 μm | 15.80% | ○ |
| Example 2 | 42.8 | 100 | 0.59 μm | 5.21 μm | 14.68% | ○ |
| Example 3 | 28.1 | 106 | 0.51 μm | 4.65 μm | 13.10% | ○ |
| Example 4 | 24.5 | 112 | 0.52 μm | 3.03 μm | 8.54% | ○ |
| Comparative Example 1 | 96.8 | 42 | 0.75 μm | 12.01 μm | 33.83% | x |

TABLE 2

|  | XRD observation | | | Sphericity(%) | | Poor mounting with ball mounter (%) |
|---|---|---|---|---|---|---|
|  | Crystal orientation | Intensity ratio (%) | Number of crystal orientations with intensity ratio of 30% or higher | Before accelerated test | After accelerated test |  |
| Example 1 | Sn(101) | 100 | 6 | 99.4 | 99.2 | 0 |
|  | Sn(211) | 90.1 |  |  |  |  |
|  | Sn(200) | 78.9 |  |  |  |  |
|  | Sn(112) | 44.1 |  |  |  |  |
|  | Sn(220) | 43 |  |  |  |  |
|  | Sn(312) | 39.2 |  |  |  |  |
|  | Sn(321) | 28.5 |  |  |  |  |
|  | Sn(301) | 24.7 |  |  |  |  |
| Comparative Example 1 | Sn(101) | 100 | 4 | 99.5 | 96.4 | 4.1 |
|  | Sn(112) | 48.3 |  |  |  |  |
|  | Sn(211) | 44.7 |  |  |  |  |
|  | Sn(312) | 30.2 |  |  |  |  |
|  | Sn(321) | 12.1 |  |  |  |  |
|  | Sn(301) | 10.5 |  |  |  |  |
|  | Sn(431) | 10.3 |  |  |  |  |
|  | Sn(420) | 9.3 |  |  |  |  |

INDUSTRIAL APPLICABILITY

The present invention can provide a conductive fine particle capable of suppressing a blackening phenomenon during storage and thus providing high connection reliability; an anisotropic conductive material containing the conductive fine particle; and a connection structure.

The invention claimed is:

1. A conductive fine particle,
which comprises a base fine particle, and a conductive layer and a low-melting point metal layer that are formed in the stated order on the surface of the base fine particle, wherein the low-melting point metal layer has an arithmetic mean surface roughness of 50 nm or lower.

2. The conductive fine particle according to claim 1, wherein the low-melting point metal layer contains tin that has, in an XRD measurement, six or more crystal orientations each having a peak intensity ratio of 30% or higher of the peak intensity of a first preferred orientation.

3. The conductive fine particle according to claim 1, further comprising
an intermetallic diffusion layer disposed between the conductive layer and the low-melting point metal layer, wherein the intermetallic diffusion layer after heated at 150° C. for 300 hours has a thickness of 20% or lower of the total thickness of the conductive layer and the low-melting point metal layer.

4. The conductive fine particle according to claim 1, wherein the low-melting point metal layer is made of tin or an alloy of tin and at least one other metal.

5. The conductive fine particle according to claim 1, wherein the conductive layer is made of copper.

6. The conductive fine particle according to claim 1, wherein the base fine particle is resin fine particle.

7. The conductive fine particle according to claim 1, wherein the base fine particle is copper fine particle.

8. An anisotropic conductive material, comprising a binder resin that has dispersed therein the conductive fine particle according to claim 1.

9. A connection structure, comprising the conductive fine particle according to claim 1.

10. A method of producing the conductive fine particle according to claim 1, the method comprising the steps of
forming a conductive layer on the surface of a base fine particle, and
forming a low-melting point metal layer on the surface of the conductive layer by bringing a low-melting point metal fine particle in contact with the base fine particle that has the conductive layer formed thereon, and then melt-softening the low-melting point metal fine particle through shear compression.

* * * * *